(12) United States Patent
Gong et al.

(10) Patent No.: US 12,525,460 B2
(45) Date of Patent: Jan. 13, 2026

(54) METHOD OF MANUFACTURING SEMICONDUCTOR STRUCTURE INCLUDING REMOVING HARD MASK LAYER AND DIELECTRIC MATERIAL LAYER EXPOSED BY PATTERNED PHOTORESIST LAYER

(71) Applicant: United Microelectronics Corp., Hsinchu (TW)

(72) Inventors: Wen Wen Gong, Singapore (SG); Xiaofei Han, Singapore (SG); Chow Yee Lim, Singapore (SG); Hong Liao, Singapore (SG); Jun Qian, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 305 days.

(21) Appl. No.: 17/404,939

(22) Filed: Aug. 17, 2021

(65) Prior Publication Data
US 2023/0025163 A1 Jan. 26, 2023

(30) Foreign Application Priority Data
Jul. 20, 2021 (CN) .......................... 202110817589.4

(51) Int. Cl.
*H01L 21/308* (2006.01)
*H10B 41/27* (2023.01)

(52) U.S. Cl.
CPC .......... *H01L 21/308* (2013.01); *H10B 41/27* (2023.02)

(58) Field of Classification Search
CPC ............................... H01L 21/308; H10B 41/27
See application file for complete search history.

(56) References Cited

U.S. PATENT DOCUMENTS

2002/0182786 A1* 12/2002 Chien .................. H01L 27/105
257/E21.654
2007/0138514 A1* 6/2007 Chang .................. H10B 10/12
257/241

(Continued)

FOREIGN PATENT DOCUMENTS

CN 105845629 8/2016

OTHER PUBLICATIONS

"Office Action of China Counterpart Application", issued on Nov. 7, 2025, p. 1-p. 11.

*Primary Examiner* — Norman D Richards
*Assistant Examiner* — Sean Ayers Winters
(74) *Attorney, Agent, or Firm* — J.C. PATENTS

(57) ABSTRACT

A method of manufacturing a semiconductor structure including the following steps is provided. A substrate is provided. The substrate has a first region and a second region. A stacked structure is formed on the substrate in the first region. The stacked structure includes a first dielectric layer, a charge storage layer, a second dielectric layer, a first conductive layer, and a first hard mask layer. A dielectric material layer is formed on the substrate in the second region. A second conductive layer is formed on the dielectric material layer in the second region. A first patterned photoresist layer is formed. The first hard mask layer exposed by the first patterned photoresist layer and a portion of the dielectric material layer exposed by the first patterned photoresist layer are removed by using the first patterned photoresist layer as a mask.

20 Claims, 6 Drawing Sheets

(56) References Cited

U.S. PATENT DOCUMENTS

| | | | |
|---|---|---|---|
| 2009/0215243 A1* | 8/2009 | Ogura | H01L 21/76224 |
| | | | 257/E21.546 |
| 2011/0294286 A1* | 12/2011 | Hung | H01L 21/0273 |
| | | | 257/E21.243 |
| 2015/0087150 A1 | 3/2015 | Wang et al. | |
| 2016/0049525 A1* | 2/2016 | Liu | H01L 29/4916 |
| | | | 438/591 |
| 2018/0166458 A1* | 6/2018 | Kang | H10B 43/40 |
| 2020/0227426 A1* | 7/2020 | Chuang | H01L 21/02164 |

\* cited by examiner

METHOD OF MANUFACTURING SEMICONDUCTOR STRUCTURE INCLUDING REMOVING HARD MASK LAYER AND DIELECTRIC MATERIAL LAYER EXPOSED BY PATTERNED PHOTORESIST LAYER

CROSS-REFERENCE TO RELATED APPLICATION

This application claims the priority benefit of China application serial no. 202110817589.4, filed on Jul. 20, 2021. The entirety of the above-mentioned patent application is hereby incorporated by reference herein and made a part of this specification.

BACKGROUND OF THE INVENTION

Field of the Invention

The invention relates to a method of manufacturing a semiconductor structure, and particularly relates to a method of manufacturing a semiconductor structure that can reduce the process complexity and the manufacturing cost.

Description of Related Art

With the advancement of semiconductor technology, the semiconductor manufacturing processes have become more and more complex, and the manufacturing cost has continued to increase. In addition, when there are different device regions on the chip, the process complexity will be further increased. Therefore, how to reduce the process complexity and the manufacturing cost is the goal of continuous efforts at present.

SUMMARY OF THE INVENTION

The invention provides a method of manufacturing a semiconductor structure, which can reduce the process complexity and the manufacturing cost.

The invention provides a method of manufacturing a semiconductor structure, which includes the following steps. A substrate is provided. The substrate has a first region and a second region. A stacked structure is formed on the substrate in the first region. The stacked structure includes a first dielectric layer, a charge storage layer, a second dielectric layer, a first conductive layer, and a first hard mask layer. The first dielectric layer is located on the substrate. The charge storage layer is located on the first dielectric layer. The second dielectric layer is located on the charge storage layer. The first conductive layer is located on the second dielectric layer. The first hard mask layer is located on the first conductive layer. A dielectric material layer is formed on the substrate in the second region. A second conductive layer is formed on the dielectric material layer in the second region. A first patterned photoresist layer is formed, wherein the first patterned photoresist layer exposes the first hard mask layer in the first region and a portion of the dielectric material layer in the second region. The first hard mask layer exposed by the first patterned photoresist layer and the portion of the dielectric material layer exposed by the first patterned photoresist layer are removed by using the first patterned photoresist layer as a mask.

According to an embodiment of the invention, in the method of manufacturing the semiconductor structure, the method of removing the first hard mask layer exposed by the first patterned photoresist layer and the portion of the dielectric material layer exposed by the first patterned photoresist layer may include performing an etching process.

According to an embodiment of the invention, in the method of manufacturing the semiconductor structure, in the etching process, a ratio of the etching rate of the first hard mask layer to the etching rate of the dielectric material layer may range from 1.5 to 1.

According to an embodiment of the invention, in the method of manufacturing the semiconductor structure, in the etching process, a ratio of the etching rate of the first hard mask layer to the etching rate of the dielectric material layer may range from 1.3 to 1.

According to an embodiment of the invention, in the method of manufacturing the semiconductor structure, the etching process is, for example, a dry etching process.

According to an embodiment of the invention, in the method of manufacturing the semiconductor structure, the first patterned photoresist layer may cover a portion of the first hard mask layer.

According to an embodiment of the invention, in the method of manufacturing the semiconductor structure, the portion of the first hard mask layer covered by the first patterned photoresist layer may be remained after the first hard mask layer exposed by the first patterned photoresist layer is removed.

According to an embodiment of the invention, in the method of manufacturing the semiconductor structure, the stacked structure may further include a second hard mask layer. The second hard mask layer is located between the first hard mask layer and the first conductive layer. The first patterned photoresist layer may expose the second hard mask layer after the first hard mask layer exposed by the first patterned photoresist layer is removed.

According to an embodiment of the invention, the method of manufacturing the semiconductor structure may further include the following step. The second hard mask layer exposed by the first patterned photoresist layer is removed by using the first patterned photoresist layer as a mask.

According to an embodiment of the invention, in the method of manufacturing the semiconductor structure, the first patterned photoresist layer may cover a portion of the second hard mask layer.

According to an embodiment of the invention, in the method of manufacturing the semiconductor structure, the portion of the second hard mask layer covered by the first patterned photoresist layer may be remained after the second hard mask layer exposed by the first patterned photoresist layer is removed.

According to an embodiment of the invention, the method of manufacturing the semiconductor structure may further include the following step. After the portion of the dielectric material layer exposed by the first patterned photoresist layer is removed, two doped regions are formed in the substrate on two sides of the second conductive layer by using the first patterned photoresist layer as a mask.

According to an embodiment of the invention, the method of manufacturing the semiconductor structure may further include the following step. After the doped regions are formed, the first patterned photoresist layer is removed.

According to an embodiment of the invention, in the method of manufacturing the semiconductor structure, the method of forming the second conductive layer may include the following steps. A conductive material layer is formed on the dielectric material layer in the second region. A hard mask material layer is conformally formed on the stacked structure and the conductive material layer. A second patterned photoresist layer is formed on the hard mask material layer in the second region. The second patterned photoresist layer is not located directly above the stacked structure in the first region. A portion of the hard mask material layer exposed by the second patterned photoresist layer is removed to form a second hard mask layer. A portion of the conductive material layer in the second region exposed by the second hard mask layer is removed.

According to an embodiment of the invention, in the method of manufacturing the semiconductor structure, the height of the first hard mask layer in the first region may be simultaneously reduced during removing the portion of the conductive material layer in the second region exposed by the second hard mask layer.

According to an embodiment of the invention, in the method of manufacturing the semiconductor structure, the first patterned photoresist layer may cover the second conductive layer.

According to an embodiment of the invention, the method of manufacturing the semiconductor structure may further include the following step. A spacer is formed on the sidewall of the stacked structure.

According to an embodiment of the invention, the method of manufacturing the semiconductor structure may further include the following step. An isolation structure is formed in the substrate in the first region.

According to an embodiment of the invention, in the method of manufacturing the semiconductor structure, a portion of the stacked structure may be located directly above the isolation structure.

According to an embodiment of the invention, in the method of manufacturing the semiconductor structure, the first region is, for example, a memory region. The second region is, for example, a logic device region.

Based on the above description, in the method of manufacturing the semiconductor structure according to an embodiment of the invention, the first hard mask layer exposed by the first patterned photoresist layer and the portion of the dielectric material layer exposed by the first patterned photoresist layer are removed by using the first patterned photoresist layer as a mask. Therefore, the process complexity and the manufacturing cost can be reduced.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1F are cross-sectional views illustrating a manufacturing process of a semiconductor structure according to an embodiment of the invention.

Figure 1A:
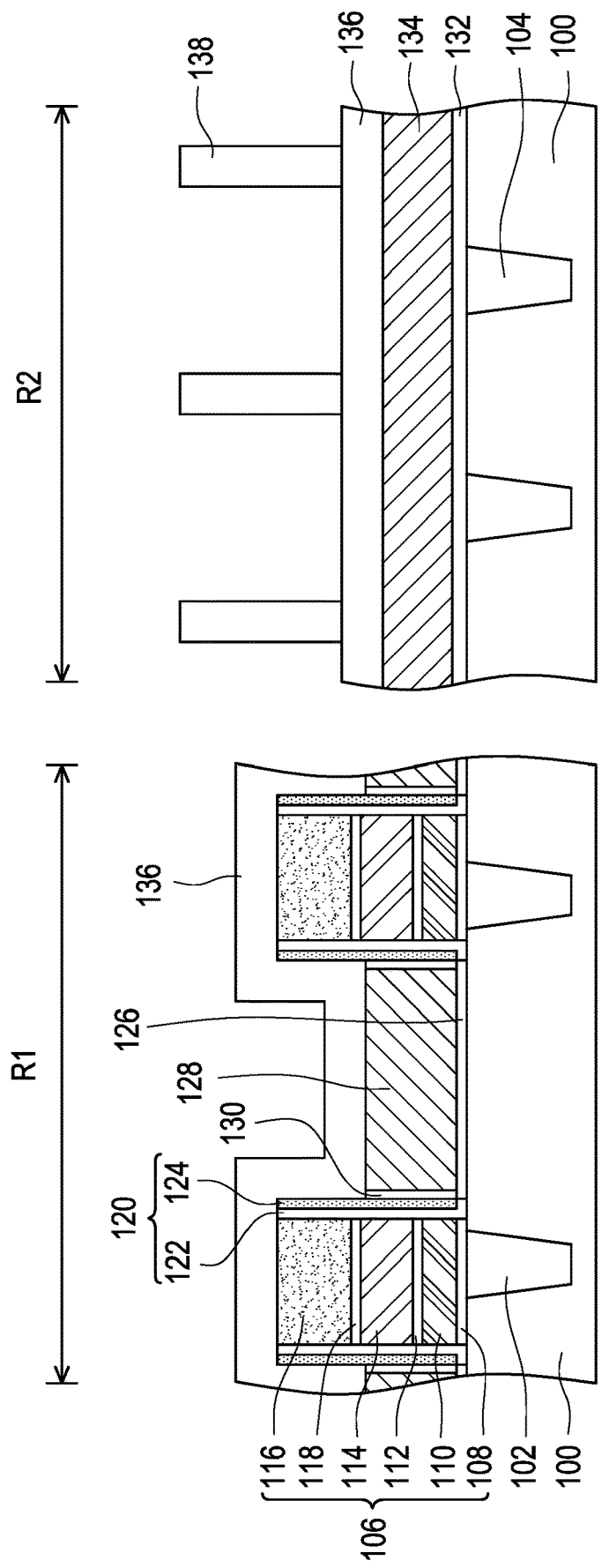
FIG. 1A to FIG. 1F are cross-sectional views illustrating a manufacturing process of a semiconductor structure according to an embodiment of the invention.

Referring to FIG. 1A, a substrate 100 is provided. The substrate 100 has a first region R1 and a second region R2. The substrate 100 may be a semiconductor substrate such as a silicon substrate. In some embodiments, the first region R1 may be a memory region, and the second region R2 may be a logic device region. For example, the memory region may be a non-volatile memory region (e.g., flash memory region), and the logic device region may be a high-voltage device region (e.g., a high-voltage transistor region), but the invention is not limited thereto. In addition, the isolation structure 102 may be formed in the substrate 100 in the first region R1. Furthermore, the isolation structure 104 may be formed in the substrate 100 in the second region R2. The isolation structure 102 and the isolation structure 104 are, for example, shallow trench isolation structures. The materials of the isolation structure 102 and the isolation structure 104 are, for example, silicon oxide. In some embodiments, the isolation structure 102 and the isolation structure 104 may be simultaneously formed by the same process.

A stacked structure 106 is formed on the substrate 100 in the first region R1. A portion of the stacked structure 106 may be located directly above the isolation structure 102. The stacked structure 106 includes a dielectric layer 108, a charge storage layer 110, a dielectric layer 112, a conductive layer 114, and a hard mask layer 116. The dielectric layer 108 is located on the substrate 100. The material of the dielectric layer 108 is, for example, silicon oxide. The charge storage layer 110 is located on the dielectric layer 108. The charge storage layer 110 is, for example, a floating gate. The material of the charge storage layer 110 is, for example, doped polysilicon, undoped polysilicon, or a combination thereof. The dielectric layer 112 is located on the charge storage layer 110. The dielectric layer 112 may be a single-layer structure or a multilayer structure. The material of the dielectric layer 112 is, for example, silicon oxide, silicon nitride, or a combination thereof. In some embodiments, the dielectric layer 112 may be a composite layer of silicon oxide layer/silicon nitride layer/silicon oxide layer (ONO). The conductive layer 114 is located on the dielectric layer 112. The conductive layer 114 may be used as a control gate. The material of the conductive layer 114 is, for example, doped polysilicon. The hard mask layer 116 is located on the conductive layer 114. The material of the hard mask layer 116 is, for example, silicon nitride. Moreover, the stacked structure 106 may further include a hard mask layer 118. The hard mask layer 118 is located between the hard mask layer 116 and the conductive layer 114. The material of the hard mask layer 118 is, for example, silicon oxide.

In addition, a spacer 120 may be formed on the sidewall of the stacked structure 106. The spacer 120 may be a single-layer structure or a multilayer structure. The material of the spacer 120 is, for example, silicon oxide, silicon nitride, or a combination thereof. In the present embodiment, the spacer 120 is, for example, a multilayer structure, but the invention is not limited thereto. For example, the spacer 120 may include a spacer 122 and a spacer 124. The spacer 122 is located on the sidewall of the stacked structure 106. The material of the spacer 122 is, for example, silicon oxide. The spacer 124 is located on the spacer 122. The material of the spacer 124 is, for example, silicon nitride.

In some embodiments, a dielectric layer 126 may be formed on the substrate 100 on one side of the spacer 120. The material of the dielectric layer 126 is, for example, silicon oxide. Furthermore, a conductive layer 128 may be formed on the dielectric layer 126. The conductive layer 128 may be a single-layer structure or a multilayer structure. The material of the conductive layer 128 is, for example, doped polysilicon. Moreover, a dielectric layer 130 may be formed between the spacer 120 and the conductive layer 128. The material of the dielectric layer 130 is, for example, silicon oxide.

On the other hand, a dielectric material layer 132 is formed on the substrate 100 in the second region R2. The material of the dielectric material layer 132 is, for example, silicon oxide. The method of forming the dielectric material layer 132 is, for example, a thermal oxidation method.

A conductive material layer 134 may be formed on the dielectric material layer 132 in the second region R2. The material of the conductive material layer 134 is, for example, doped polysilicon. The method of forming the conductive material layer 134 is, for example, a chemical vapor deposition (CVD) method.

A hard mask material layer 136 may be conformally formed on the stacked structure 106 and the conductive material layer 134. The material of the hard mask material layer 136 is, for example, silicon oxide. The method of forming the hard mask material layer 136 is, for example, a CVD method.

A patterned photoresist layer 138 may be formed on the hard mask material layer 136 in the second region R2. In some embodiments, the patterned photoresist layer 138 is not located directly above the stacked structure 106 in the first region R1. The patterned photoresist layer 138 may be formed by a lithography process.

Figure 1B:
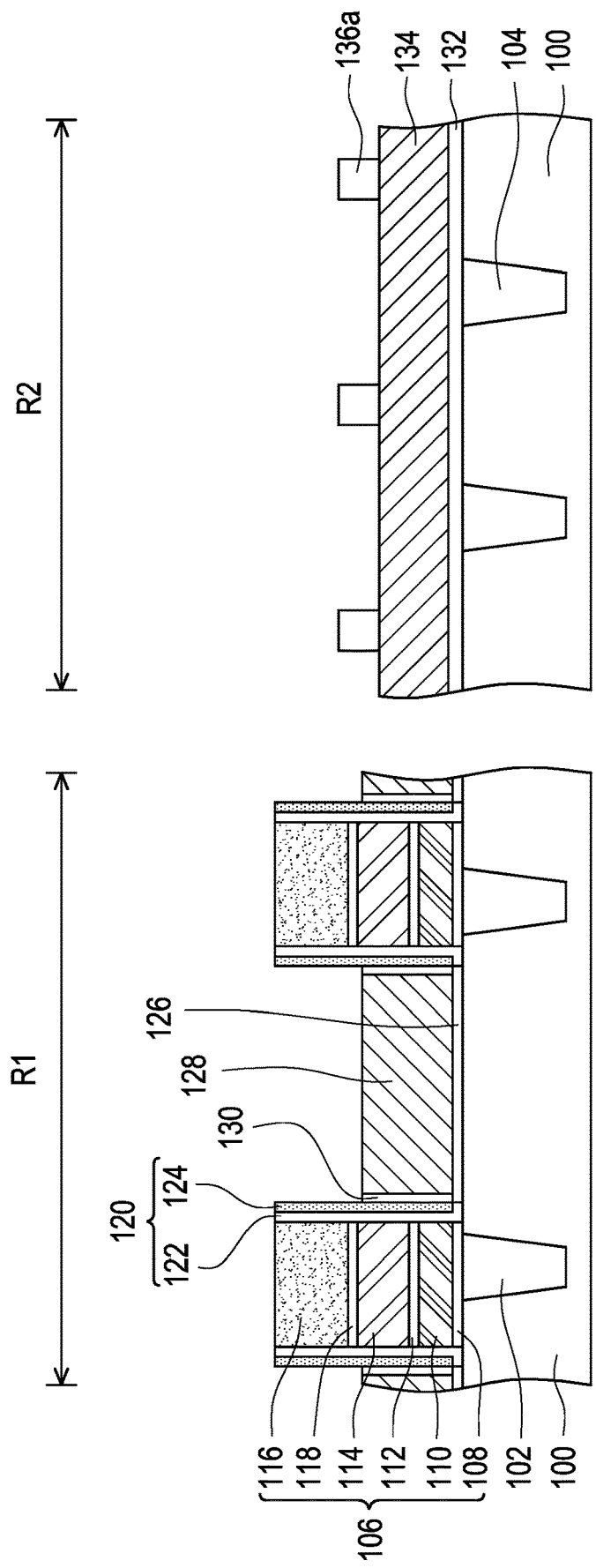

Referring to FIG. 1B, a portion of the hard mask material layer 136 exposed by the patterned photoresist layer 138 may be removed to form a hard mask layer 136a. That is, in the first region R1 and the second region R2, the hard mask material layer 136 not covered by the patterned photoresist layer 138 is removed. In addition, the method of removing the portion of the hard mask material layer 136 exposed by the patterned photoresist layer 138 is, for example, a dry etching method.

The patterned photoresist layer 138 may be removed. The method of removing the patterned photoresist layer 138 is, for example, a dry stripping method or a wet stripping method.

Figure 1C:
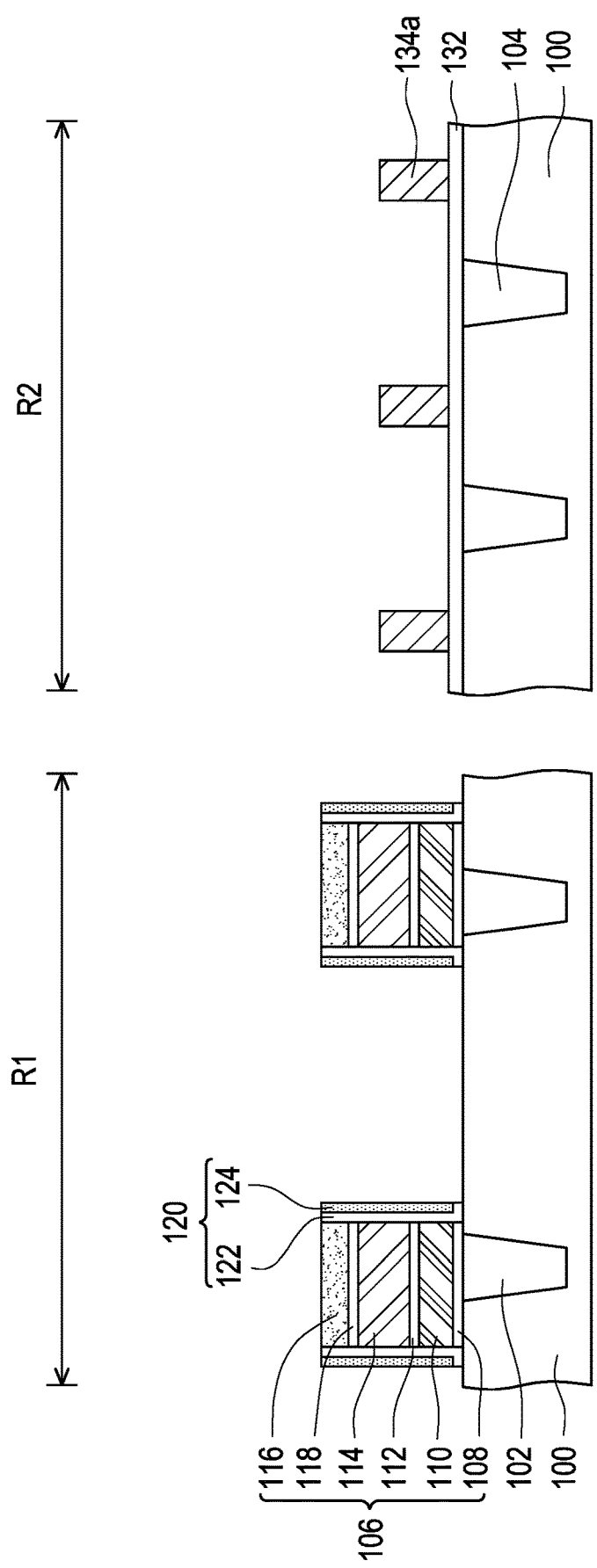

Referring to FIG. 1C, a portion of the conductive material layer 134 in the second region R2 exposed by the hard mask layer 136a may be removed, so that the conductive layer 134a may be formed on the dielectric material layer 132 in the second region R2. The conductive layer 134a may be used as a gate. The method of removing the portion of the conductive material layer 134 exposed by the hard mask layer 136a is, for example, a dry etching method. In some embodiments, the height of the hard mask layer 116 in the first region R1 may be simultaneously reduced during removing the portion of the conductive material layer 134 in the second region R2 exposed by the hard mask layer 136a. In some embodiments, the height of the spacer 120 in the first region R1 may be simultaneously reduced during removing the portion of the conductive material layer 134 in the second region R2 exposed by the hard mask layer 136a. In some embodiments, the conductive layer 128 in the first region R1 may be simultaneously removed during removing the portion of the conductive material layer 134 in the second region R2 exposed by the hard mask layer 136a.

In some embodiments, during the etching process of removing the portion of the conductive material layer 134 exposed by the hard mask layer 136a, the hard mask layer 136a may be gradually consumed and removed, but the invention is not limited thereto. In other embodiments, the hard mask layer 136a may be removed by an additional process (e.g., etching process). In some embodiments, after the conductive layer 134a is formed, a cleaning process may be performed. In addition, the dielectric layer 126 and the dielectric layer 130 may be removed in the cleaning process.

Figure 1D:
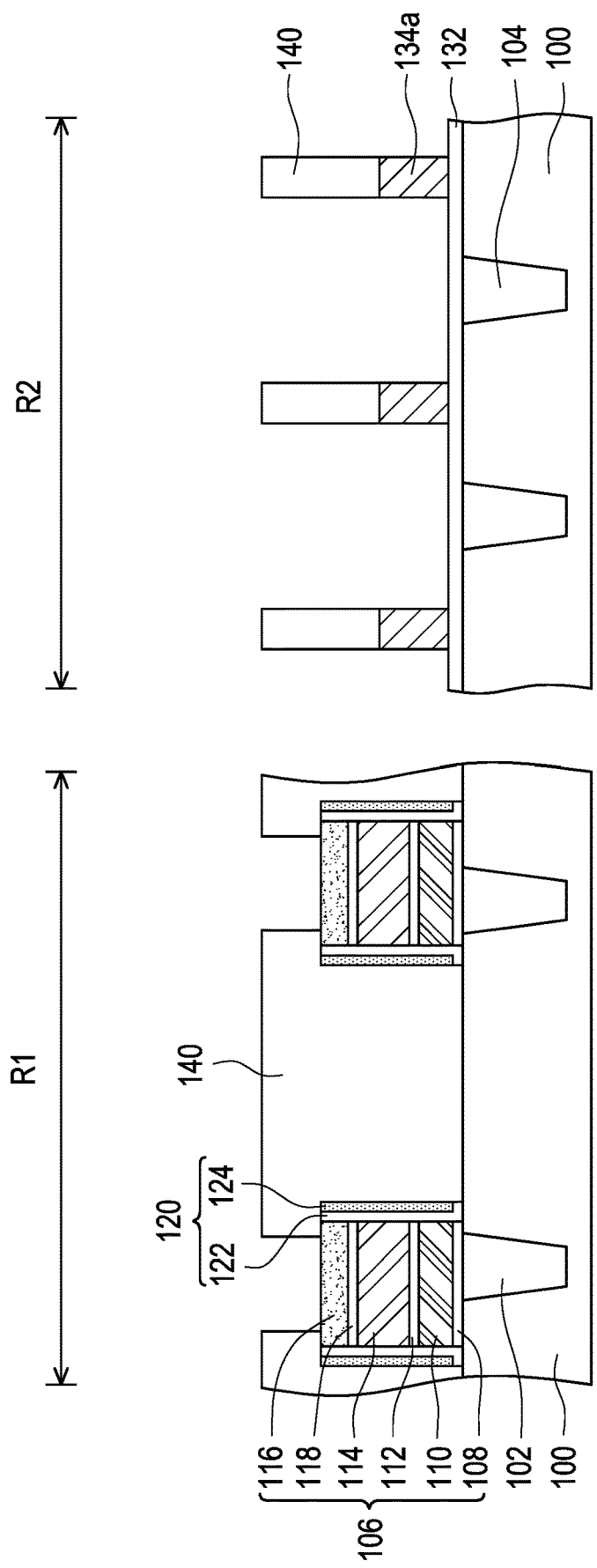

Referring to FIG. 1D, a patterned photoresist layer 140 is formed, wherein the patterned photoresist layer 140 exposes the hard mask layer 116 in the first region R1 and a portion of the dielectric material layer 132 in the second region R2. In some embodiments, the patterned photoresist layer 140 may cover the conductive layer 134a. In some embodiments, the patterned photoresist layer 140 may cover a portion of the hard mask layer 116 and a portion of the hard mask layer 118. The patterned photoresist layer 140 may be formed by a lithography process.

Figure 1E:
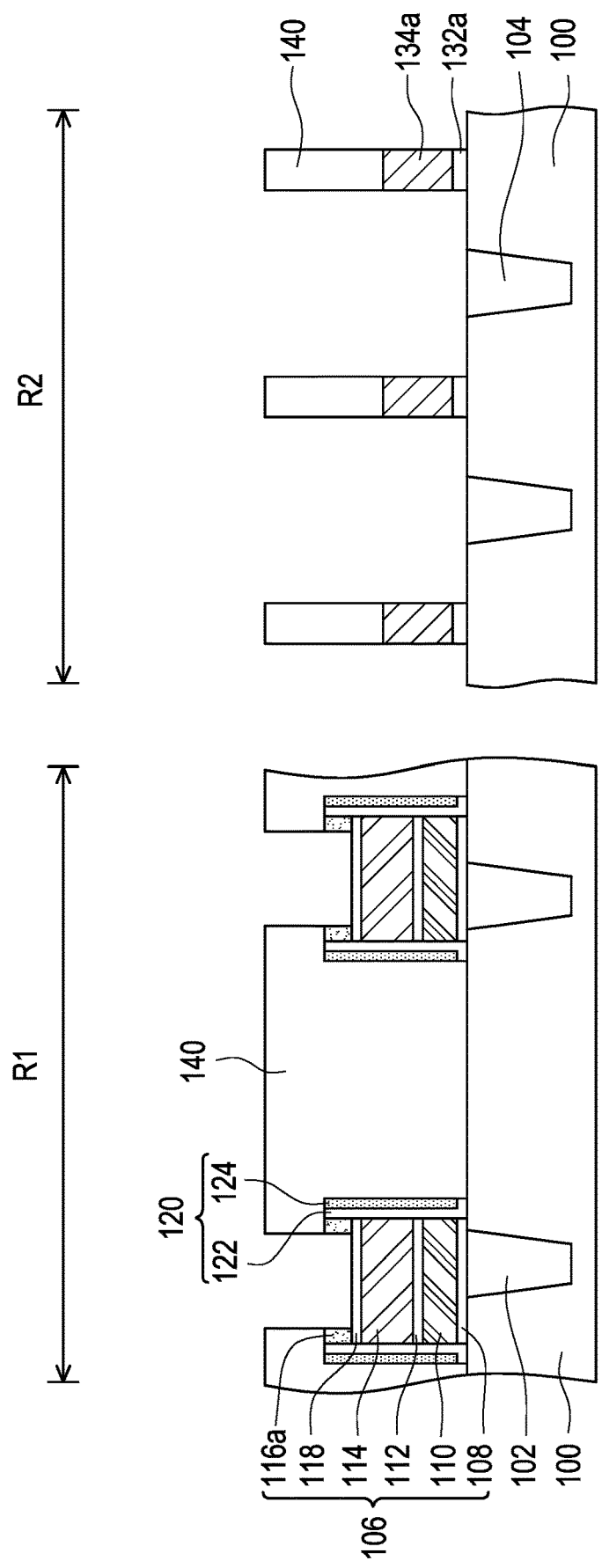

Referring to FIG. 1E, the hard mask layer 116 exposed by the patterned photoresist layer 140 and the portion of the dielectric material layer 132 exposed by the patterned photoresist layer 140 are removed by using the patterned photoresist layer 140 as a mask. Therefore, a dielectric layer 132a located between the conductive layer 134a and the substrate 100 may be formed. The dielectric layer 132a may be used as a gate dielectric layer. In some embodiments, the portion of the hard mask layer 116 covered by the patterned photoresist layer 140 may be remained to form a hard mask layer 116a after the hard mask layer 116 exposed by the patterned photoresist layer 140 is removed. Furthermore, the patterned photoresist layer 140 and the hard mask layer 116a may expose the hard mask layer 118 after the hard mask layer 116 exposed by the patterned photoresist layer 140 is removed.

Moreover, the method of removing the hard mask layer 116 exposed by the patterned photoresist layer 140 and the portion of the dielectric material layer 132 exposed by the patterned photoresist layer 140 may include performing an etching process. The etching process is, for example, a dry etching process. In some embodiments, in the etching process, a ratio of the etching rate of the hard mask layer 116 to the etching rate of the dielectric material layer 132 may range from 1.5 to 1. In some embodiments, in the etching process, a ratio of the etching rate of the hard mask layer 116 to the etching rate of the dielectric material layer 132 may range from 1.3 to 1.

Figure 1F:
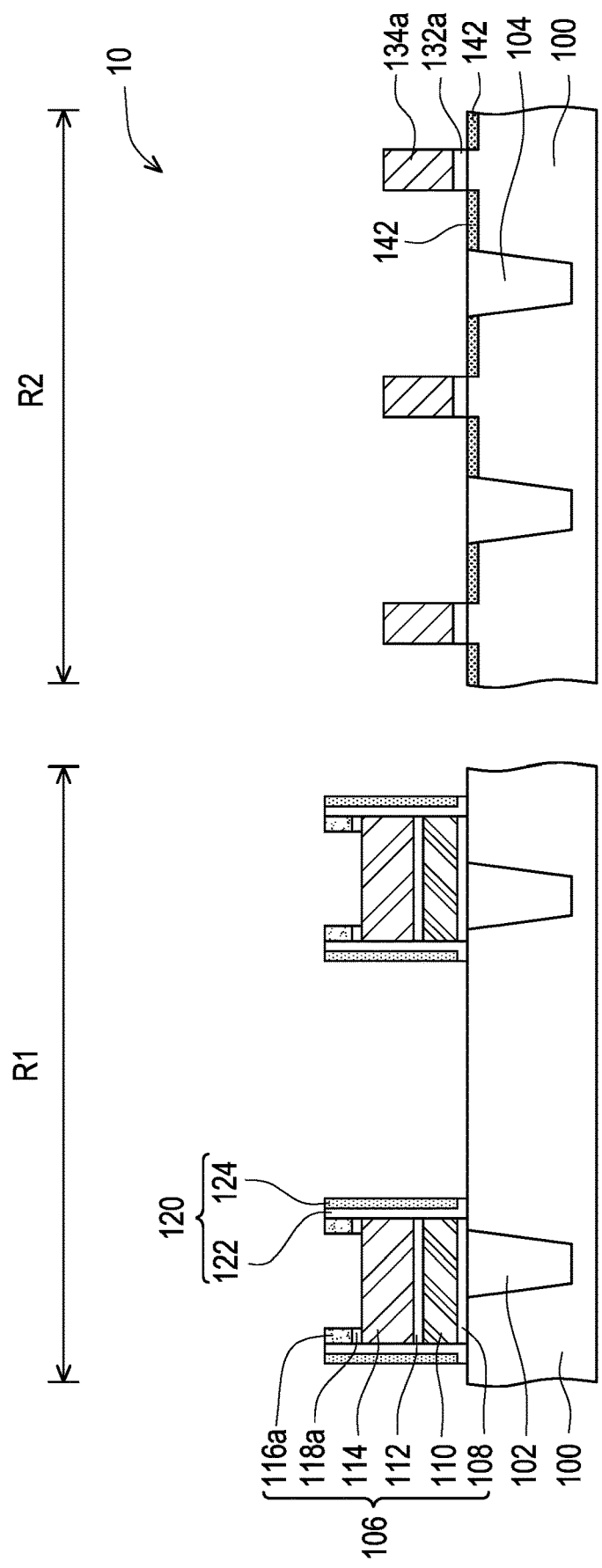

Referring to FIG. 1F, after the portion of the dielectric material layer 132 exposed by the patterned photoresist layer 140 is removed, two doped regions 142 may be formed in the substrate 100 on two sides of the conductive layer 134a by using the patterned photoresist layer 140 as a mask. The doped region 142 may be a lightly doped drain (LDD) region. The method of forming the doped region 142 is, for example, an ion implantation method.

In some embodiments, the hard mask layer 118 exposed by the patterned photoresist layer 140 is removed by using the patterned photoresist layer 140 as a mask. Therefore, the conductive layer 114 may be exposed to facilitate the formation of a contact (not shown) electrically connected to the conductive layer 114 in a subsequent process. Moreover, the hard mask layer 118 exposed by the patterned photoresist layer 140 may be removed before or after the doped region 142 is formed. In some embodiments, the portion of the hard mask layer 118 covered by the patterned photoresist layer 140 may be remained to form a hard mask layer 118a after the hard mask layer 118 exposed by the patterned photoresist layer 140 is removed. In addition, the method of removing the hard mask layer 118 exposed by the patterned photoresist layer 140 is, for example, a dry etching process.

In the present embodiment, before the patterned photoresist layer 140 is removed, the hard mask layer 118 exposed by the patterned photoresist layer 140 is removed to expose the conductive layer 114, but the invention is not limited thereto. In other embodiments, after the patterned photoresist layer 140 is removed, the hard mask layer 118 exposed by the hard mask layer 116*a* may be removed by a subsequent process (e.g., etching process) to expose the conductive layer 114.

Furthermore, after the doped regions 142 are formed, the patterned photoresist layer 140 may be removed. The method of removing the patterned photoresist layer 140 is, for example, a dry stripping method or a wet stripping method.

In addition, the subsequent processes for forming the device (e.g., memory device) in the first region R1 and the device (e.g., logic device) in the second region R2 are well-known to one of ordinary skill in the art, and the description thereof is omitted here.

Based on the above embodiment, in the method of manufacturing the semiconductor structure 10, the hard mask layer 116 exposed by the patterned photoresist layer 140 and the portion of the dielectric material layer 132 exposed by the patterned photoresist layer 140 are removed by using the patterned photoresist layer 140 as a mask. Therefore, the number of the process steps and the number of photomasks can be reduced, thereby reducing the process complexity and the manufacturing cost.

In summary, in the method of manufacturing the semiconductor structure in the aforementioned embodiments, since the manufacturing process of the device in the first region can be integrated with the manufacturing process of the device in the second region, the number of the process steps and the number of photomasks can be reduced, thereby reducing the process complexity and the manufacturing cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a semiconductor structure, comprising:
    providing a substrate, wherein the substrate has a first region and a second region;
    forming a stacked structure on the substrate in the first region, wherein the stacked structure comprises:
        a first dielectric layer located on the substrate;
        a charge storage layer located on the first dielectric layer;
        a second dielectric layer located on the charge storage layer;
        a first conductive layer located on the second dielectric layer; and
        a first hard mask layer located on the first conductive layer;
    forming a dielectric material layer on the substrate in the second region;
    forming a second conductive layer on the dielectric material layer in the second region, wherein the dielectric material layer is located between the second conductive layer and the substrate;
    forming a first patterned photoresist layer, wherein the first patterned photoresist layer is formed by a lithography process, the first patterned photoresist layer exposes the first hard mask layer in the first region and a portion of the dielectric material layer in the second region before removing the first hard mask layer exposed by the first patterned photoresist layer and the portion of the dielectric material layer exposed by the first patterned photoresist layer by using the first patterned photoresist layer as a mask, and the first patterned photoresist layer is in direct contact with a top surface of the second conductive layer; and
    removing the first hard mask layer exposed by the first patterned photoresist layer and located directly above the charge storage layer and the portion of the dielectric material layer exposed by the first patterned photoresist layer by using the first patterned photoresist layer as a mask.

2. The method of manufacturing the semiconductor structure according to claim 1, wherein a method of removing the first hard mask layer exposed by the first patterned photoresist layer and the portion of the dielectric material layer exposed by the first patterned photoresist layer comprises performing an etching process.

3. The method of manufacturing the semiconductor structure according to claim 2, wherein in the etching process, a ratio of an etching rate of the first hard mask layer to an etching rate of the dielectric material layer ranges from 1.5 to 1.

4. The method of manufacturing the semiconductor structure according to claim 2, wherein in the etching process, a ratio of an etching rate of the first hard mask layer to an etching rate of the dielectric material layer ranges from 1.3 to 1.

5. The method of manufacturing the semiconductor structure according to claim 2, wherein the etching process comprises a dry etching process.

6. The method of manufacturing the semiconductor structure according to claim 1, wherein the first patterned photoresist layer covers a portion of the first hard mask layer.

7. The method of manufacturing the semiconductor structure according to claim 6, wherein the portion of the first hard mask layer covered by the first patterned photoresist layer is remained after removing the first hard mask layer exposed by the first patterned photoresist layer.

8. The method of manufacturing the semiconductor structure according to claim 1, wherein the stacked structure further comprises:
    a second hard mask layer located between the first hard mask layer and the first conductive layer, wherein
    the first patterned photoresist layer exposes the second hard mask layer after removing the first hard mask layer exposed by the first patterned photoresist layer.

9. The method of manufacturing the semiconductor structure according to claim 8, further comprising:
    removing the second hard mask layer exposed by the first patterned photoresist layer by using the first patterned photoresist layer as a mask.

10. The method of manufacturing the semiconductor structure according to claim 9, wherein the first patterned photoresist layer covers a portion of the second hard mask layer.

11. The method of manufacturing the semiconductor structure according to claim 10, wherein the portion of the second hard mask layer covered by the first patterned photoresist layer is remained after removing the second hard mask layer exposed by the first patterned photoresist layer.

12. The method of manufacturing the semiconductor structure according to claim 1, further comprising:
    after removing the portion of the dielectric material layer exposed by the first patterned photoresist layer, forming two doped regions in the substrate on two sides of the second conductive layer by using the first patterned photoresist layer as a mask.

13. The method of manufacturing the semiconductor structure according to claim 12, further comprising:
   after forming the two doped regions, removing the first patterned photoresist layer.

14. The method of manufacturing the semiconductor structure according to claim 1, wherein a method of forming the second conductive layer comprises:
   forming a conductive material layer on the dielectric material layer in the second region;
   conformally forming a hard mask material layer on the stacked structure and the conductive material layer;
   forming a second patterned photoresist layer on the hard mask material layer in the second region, wherein the second patterned photoresist layer is not located directly above the stacked structure in the first region;
   removing a portion of the hard mask material layer exposed by the second patterned photoresist layer to form a second hard mask layer; and
   removing a portion of the conductive material layer in the second region exposed by the second hard mask layer.

15. The method of manufacturing the semiconductor structure according to claim 14, wherein a height of the first hard mask layer in the first region is simultaneously reduced during removing the portion of the conductive material layer in the second region exposed by the second hard mask layer.

16. The method of manufacturing the semiconductor structure according to claim 1, wherein the first patterned photoresist layer covers the second conductive layer.

17. The method of manufacturing the semiconductor structure according to claim 1, further comprising:
   forming a spacer on a sidewall of the stacked structure.

18. The method of manufacturing the semiconductor structure according to claim 1, further comprising:
   forming an isolation structure in the substrate in the first region.

19. The method of manufacturing the semiconductor structure according to claim 18, wherein a portion of the stacked structure is located directly above the isolation structure.

20. The method of manufacturing the semiconductor structure according to claim 1, wherein the first region comprises a memory region, and the second region comprises a logic device region.

* * * * *